(12) United States Patent
Yoon et al.

(10) Patent No.: US 8,130,512 B2
(45) Date of Patent: Mar. 6, 2012

(54) INTEGRATED CIRCUIT PACKAGE SYSTEM AND METHOD OF PACKAGE STACKING

(75) Inventors: In Sang Yoon, Ichon-si (KR); SeongMin Lee, Seoul (KR); Sungmin Song, Inchon (KR)

(73) Assignee: STATS Chippac Ltd., Singapore (SG)

( * ) Notice: Subject to any disclaimer, the term of this patent is extended or adjusted under 35 U.S.C. 154(b) by 610 days.

(21) Appl. No.: 12/273,541

(22) Filed: Nov. 18, 2008

(65) Prior Publication Data

US 2010/0123233 A1     May 20, 2010

(51) Int. Cl.
*H01R 9/00* (2006.01)
(52) U.S. Cl. ........ 361/790; 361/704; 361/719; 361/760; 361/764; 257/666; 257/698; 257/723; 257/737; 257/777; 438/109; 438/117; 438/122; 438/127; 438/200

(58) Field of Classification Search .................. 361/790, 361/704, 719, 764, 760; 257/666, 698, 723, 257/737, 777; 438/109, 117, 122, 127, 200
See application file for complete search history.

(56) References Cited

U.S. PATENT DOCUMENTS 4,054,938 A  *  10/1977  Morris, Sr. .................... 361/764
(Continued)

*Primary Examiner* — Xiaoliang Chen
(74) *Attorney, Agent, or Firm* — Mikio Ishimaru

(57) ABSTRACT

A method of manufacturing an integrated circuit package system including: providing a circuit board having an interconnect thereon; mounting a first device offset on the circuit board; and applying a first encapsulant of a first thickness over the first device, the first encapsulant of a second thickness thinner than the first thickness over the remainder of the circuit board with the interconnect exposed, or a second encapsulant of a third thickness over a second device on an opposite surface of the circuit board and differently offset from the first device.

20 Claims, 6 Drawing Sheets

U.S. PATENT DOCUMENTS

| | | | | |
|---|---|---|---|---|
| 4,729,061 | A * | 3/1988 | Brown | 361/719 |
| 5,598,033 | A | 1/1997 | Behlen et al. | |
| 5,639,695 | A * | 6/1997 | Jones et al. | 438/126 |
| 5,817,535 | A * | 10/1998 | Akram | 438/15 |
| 6,232,659 | B1 * | 5/2001 | Clayton | 257/724 |
| 6,343,171 | B1 * | 1/2002 | Yoshimura et al. | 385/50 |
| 6,388,333 | B1 * | 5/2002 | Taniguchi et al. | 257/777 |
| 6,424,034 | B1 * | 7/2002 | Ahn et al. | 257/723 |
| 6,492,203 | B1 * | 12/2002 | Wakashima et al. | 438/127 |
| 6,549,413 | B2 * | 4/2003 | Karnezos et al. | 361/704 |
| 6,611,635 | B1 * | 8/2003 | Yoshimura et al. | 385/14 |
| 6,684,007 | B2 * | 1/2004 | Yoshimura et al. | 385/31 |
| 6,690,845 | B1 * | 2/2004 | Yoshimura et al. | 385/14 |
| 6,876,074 | B2 | 4/2005 | Kim | |
| 6,982,491 | B1 * | 1/2006 | Fan et al. | 257/778 |
| 6,987,314 | B1 * | 1/2006 | Yoshida et al. | 257/698 |
| 7,061,087 | B2 * | 6/2006 | Kim | 257/686 |
| 7,061,122 | B2 * | 6/2006 | Kim et al. | 257/778 |
| 7,187,070 | B2 | 3/2007 | Chu et al. | |
| 7,901,987 | B2 * | 3/2011 | Yang et al. | 438/109 |
| 2002/0015340 | A1 | 2/2002 | Batinovich | 365/200 |
| 2002/0074630 | A1 | 6/2002 | Ando et al. | 257/666 |
| 2002/0127778 | A1 | 9/2002 | Karenzos et al. | 438/122 |
| 2002/0149097 | A1 * | 10/2002 | Lee et al. | 257/686 |
| 2003/0069654 | A1 * | 4/2003 | Larson | 700/86 |
| 2003/0102546 | A1 * | 6/2003 | Lee et al. | 257/686 |
| 2003/0164550 | A1 * | 9/2003 | Lee et al. | 257/777 |
| 2004/0007750 | A1 * | 1/2004 | Anderson et al. | 257/414 |
| 2004/0012992 | A1 * | 1/2004 | Koh et al. | 365/63 |
| 2004/0084771 | A1 * | 5/2004 | Bolken et al. | 257/738 |
| 2004/0178488 | A1 * | 9/2004 | Bolken et al. | 257/686 |
| 2005/0018505 | A1 * | 1/2005 | Wallace | 365/202 |
| 2005/0090050 | A1 * | 4/2005 | Shim et al. | 438/200 |
| 2005/0218518 | A1 * | 10/2005 | Jiang et al. | 257/738 |
| 2006/0033517 | A1 * | 2/2006 | Khandros et al. | 324/754 |
| 2006/0055024 | A1 * | 3/2006 | Wehrly | 257/693 |
| 2006/0128059 | A1 * | 6/2006 | Ahn et al. | 438/108 |
| 2006/0242477 | A1 * | 10/2006 | Larson | 714/704 |
| 2007/0045796 | A1 * | 3/2007 | Ye et al. | 257/678 |
| 2007/0181989 | A1 * | 8/2007 | Corisis et al. | 257/686 |
| 2007/0216006 | A1 * | 9/2007 | Park et al. | 257/686 |
| 2007/0216007 | A1 * | 9/2007 | Lee et al. | 257/686 |
| 2007/0290314 | A1 * | 12/2007 | Partridge et al. | 257/686 |
| 2008/0079149 | A1 * | 4/2008 | Hedler et al. | 257/737 |
| 2008/0108179 | A1 * | 5/2008 | Mistry et al. | 438/117 |
| 2008/0203584 | A1 | 8/2008 | Katagiri et al. | |
| 2008/0258283 | A1 * | 10/2008 | Shimoto et al. | 257/678 |
| 2008/0315375 | A1 * | 12/2008 | Eichelberger et al. | 257/659 |
| 2008/0315404 | A1 * | 12/2008 | Eichelberger et al. | 257/713 |
| 2008/0316714 | A1 * | 12/2008 | Eichelberger et al. | 361/728 |
| 2009/0011541 | A1 * | 1/2009 | Corisis et al. | 438/109 |
| 2009/0085199 | A1 * | 4/2009 | Yoon et al. | 257/723 |
| 2009/0166824 | A1 * | 7/2009 | Do et al. | 257/676 |
| 2009/0166834 | A1 * | 7/2009 | Yoon et al. | 257/686 |

* cited by examiner

INTEGRATED CIRCUIT PACKAGE SYSTEM AND METHOD OF PACKAGE STACKING

TECHNICAL FIELD

The present invention relates generally to an integrated circuit package system with stackable packages and more particularly to packages and methods for package stacking.

BACKGROUND ART

The integrated circuit package is the building block used in a high performance electronic system to provide applications for usage in products such as automotive vehicles, pocket personal computers, intelligent portable military devices, aeronautical spacecraft payloads, and a vast line of other similar products that require small compact electronics supporting many complex functions.

The integrated circuit package can include a package base or package substrate providing a mounting structure for attachment of at least one chip or die and an enclosure such as an epoxy applied on it to protect its contents. Typically, one side of the chip or die is used primarily for the mounting the chip or die.

The other side of the chip or die, referred to as an active surface of the chip or die, has electrically conductive areas that provide for electrical connections to its circuitry. Connectors, consisting of electrically conductive material, attach to the conductive areas to provide electrical connection between the circuitry of the chip or die and other circuitry not of the same chip or die.

The other circuitry can be from several possible sources. One possible source can be circuitry resident within the integrated circuit package, such as from another chip, indicative of a multiple chip integrated circuit package. Another possible source can be of circuitry residing outside the integrated circuit package such as from a printed circuit board within the electronic system.

Yet another possible source can be circuitry from one or more separate integrated circuit packages having one or more chips or dice within it. The separate integrated circuit packages can be connected with the conductors and enclosed together resulting in a single sealed package structure, externally connected onto the single sealed package structure, or simply individually connected together as separate structures. Integrated circuit packages with small footprints and high internal IO connectivity are sought after for products with small printed circuit board systems. Global market demands also require solutions that provide lower costs and higher reliability through simplified manufacturing processing and early testing of circuitry for known good die (KGD) during fabrication which result in higher yield and improved circuitry reliability. In addition, the advantage and flexibility provided by replacing package components as needed contribute to market leadership.

Attempts have failed to provide a complete solution addressing simplified manufacturing processing, smaller dimensions, lower costs due to design flexibility, reduced package counts, increased functionality, leveragability, and increased IO connectivity capabilities.

In view of the ever-increasing commercial competitive pressures, along with growing consumer expectations and the diminishing opportunities for meaningful product differentiation in the marketplace, it is critical that answers be found for these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacturing an integrated circuit package system including: providing a circuit board having an interconnect thereon; mounting a first device offset on the circuit board; and applying a first encapsulant of a first thickness over the first device, the first encapsulant of a second thickness thinner than the first thickness over the remainder of the circuit board with the interconnect exposed, or a second encapsulant of a third thickness over a second device on an opposite surface of the circuit board and differently offset from the first device.

The present invention provides an integrated circuit package system including: a circuit board having an interconnect thereon; a first device mounted offset on the circuit board; and a first encapsulant of a first thickness applied over the first device, the first encapsulant of a second thickness thinner than the first thickness applied over the remainder of the circuit board with the interconnect exposed, or a second encapsulant of a third thickness applied over a second device on an opposite surface of the circuit board and differently offset from the first device.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
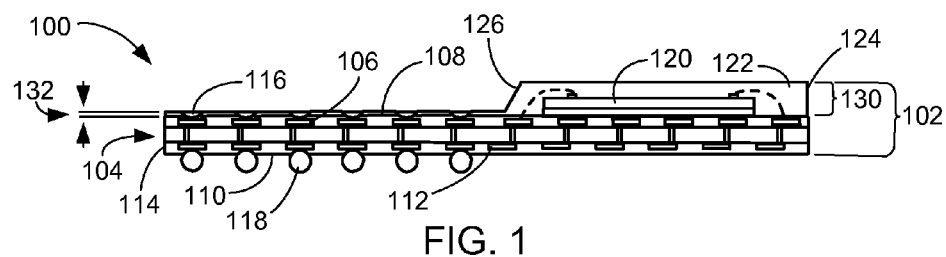
FIG. 1 is a cross-sectional view of an integrated circuit package system in a first embodiment of the present invention taken along a line 1-1 of FIG. 2.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs.

Where multiple embodiments are disclosed and described, having some features in common, for clarity and ease of illustration, description, and comprehension thereof, similar and like features one to another will ordinarily be described with like reference numerals. The embodiments may be numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the invention, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "on" as used herein means and refers to direct contact among elements. The term "processing" as used herein includes deposition of material, patterning, exposure, development, etching, cleaning, and/or removal of the material or trimming as required in forming a described structure. The term "subpackage" as used herein is defined as an assembly having a substrate with contacts, circuitry, and protective material over a surface and the circuitry of the substrate.

Figure 2:
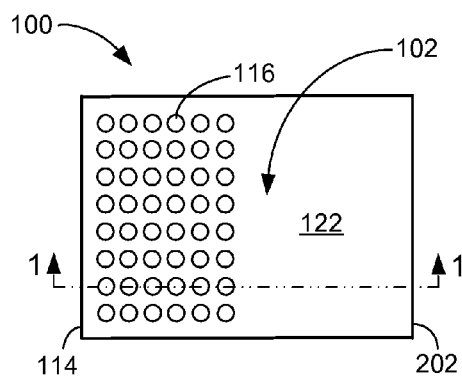
FIG. 2 is a top view of the integrated circuit package system.

Referring now to FIG. 1, therein is shown a cross-sectional view of an integrated circuit package system 100 in a first embodiment of the present invention taken along a line 1-1 of FIG. 2. The integrated circuit package system 100 can preferably include a subpackage 102, such as an indirectly supported package with a single mountable component surface having a circuit board 104 with contacts 106 exposed and adjacent below a first surface 108 and a second surface 110. The circuit board 104 also includes embedded contacts 112 located within the circuit board 104.

The circuit board 104 can preferably include conductive material distributed between the first surface 108 and the second surface 110 to provide connectivity between the contacts 106 and the embedded contacts 112.

The contacts 106 adjacent the first surface 108 can be located between an edge 114 of the circuit board 104 and a plane perpendicular and bisecting the central cross-section of the circuit board 104. The contacts 106 adjacent the second surface 110 can be located below the contacts 106 of the first surface 108.

Interconnects 116, such as solder or similar propertied material having a trough, spherical, or flattened-spherical formed cross-sectional shape, can be connected to the contacts 106 located between the edge 114 and the plane perpendicular adjacent the first surface 108 to provide connectivity between the subpackage 102 and a next level of package integration. Stacking interconnects 118, such as solder or similar propertied material having a spherical, cylindrical, or any geometrical shape, can be connected to the contacts 106 of the second surface 110. The stacking interconnects 118, substantially exposed on the second surface 110, can provide additional connectivity between the subpackage 102 and another level of package integration.

A first device 120, such as a wire bond chip, a flip chip, a die, or other combination of components with circuitry, having connectivity with the circuit board 104 can be mounted between the plane perpendicular and bisecting the central cross-section of the circuit board 104 and the end of the circuit board 104 opposite the end next to the edge 114 of the first surface 108. A first encapsulant 122, such as an epoxy, molding, or similar type of protective material having a first thickness 130, can be applied over the first device 120 and surround connectivity structures and areas next to the first device 120. The first encapsulant 122 having a second thickness 132 can be applied over the remainder of the first surface 108 surrounding the interconnects 116 with the interconnects 116 exposed adjacent the first encapsulant 122. The magnitude of first thickness 130 can be substantially greater than the magnitude of the second thickness 132.

An encapsulant side 124 of the first encapsulant 122 nearest the end of the circuit board 104 opposite the end with the edge 114 can be perpendicular to the first surface 108. Other encapsulant sides 126 of the first encapsulant 122 surrounding the first device 120 can be perpendicular to or oblique to the first surface 108.

Note that the orientation, shape, or finish of the encapsulant side 124 and of the other encapsulant sides 126 of the first encapsulant 122 are non-restrictive. Also the physical characteristics such as location, distribution, quantity, size, shape, or material of the contacts 106, the interconnects 116, or the stacking interconnects 118 have been chosen for illustrative purposes only. The physical characteristics of the present invention are non-limiting in these aspects and should not be construed as limitations for the present invention.

It has been discovered that the first encapsulant 122 applied onto the surface of the subpackage 102 can significantly improve the structural and thermal stability of the subpackage 102 as-well-as packages or subsystems attached to the subpackage 102.

It has been found that the interconnects 116 and the stacking interconnects 118 can substantially increase package connectivity attributed as-well-as pad pitch density improvements. It has also been found the first encapsulant 122 accommodates many different physical geometries of the interconnects 116 that can result in a wide variety of package sizes, connectivity options, or performance characteristics of package systems.

Referring now to FIG. 2, therein is shown a top view of the integrated circuit package system 100. The interconnects 116 of the subpackage 102 are shown exposed adjacent the first encapsulant 122 and distributed between the edge 114 and a line on the surface of the first encapsulant 122 located equidistant from the edge 114 and a far edge 202 of the circuit board 104, opposite and facing away from the edge 114. The first thickness 130 of FIG. 1 of the first encapsulant 122 directly covers the first device 120 of FIG. 1, the central cross-section of the circuit board 104, and extends to the far edge 202. The second thickness 132 of FIG. 1 or another thickness, offset from the first device 120, directly covers the circuit board 104 from the central cross-section to the edge 114.

For illustrative purposes, the interconnects 116 are shown distributed in a rectangular grid arrayed pattern nearest the edge 114. It is noted that the interconnects 116 could have been implemented having other locations or patterns adjacent the first encapsulant 122 such as circular clusters or as random patterns. The positioning and the arrangements of the interconnects 116 are non-restrictive or non-limiting.

Figure 3:
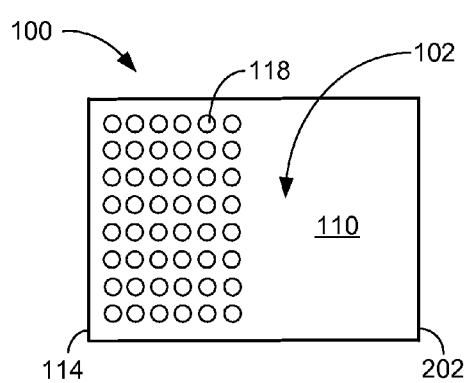
FIG. 3 is a bottom view of the integrated circuit package system.

Referring now to FIG. 3, therein is shown a bottom view of the integrated circuit package system 100. The stacking interconnects 118 of the subpackage 102 are shown exposed adjacent the second surface 110 and distributed between the edge 114 and a line on the second surface 110 located equidistant from the edge 114 and the far edge 202.

For illustrative purposes, the stacking interconnects 118 are shown distributed in a rectangular grid arrayed pattern nearest the edge 114. It is noted that the stacking interconnects 118 could have been implemented having other locations or patterns adjacent the second surface 110 such as circular clusters or as random patterns. The positioning and the arrangements of the stacking interconnects 118 are non-restrictive or non-limiting.

Figure 4:
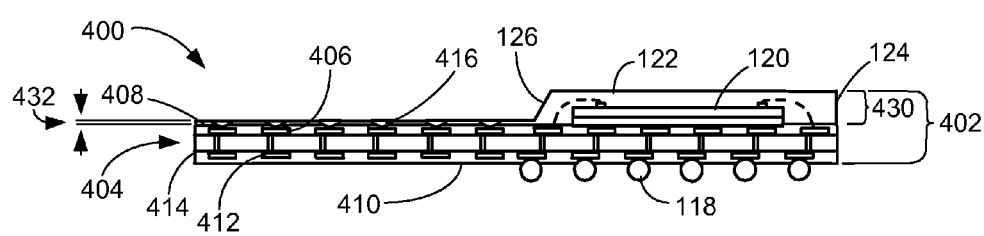
FIG. 4 is a cross-sectional view of an integrated circuit package system in a second embodiment of the present invention taken along a line 4-4 of FIG. 5.
Figure 5:
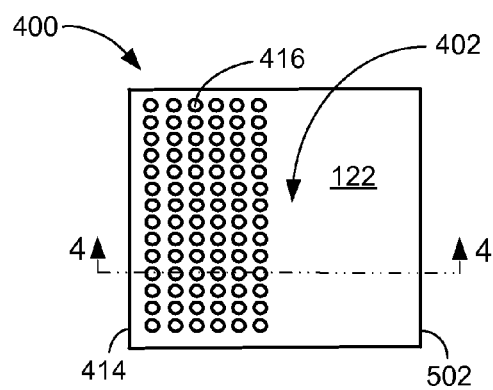
FIG. 5 is a top view of the integrated circuit package system.

Referring now to FIG. 4, therein is shown a cross-sectional view of an integrated circuit package system 400 in a second embodiment of the present invention taken along a line 4-4 of FIG. 5. The integrated circuit package system 400 can preferably include a subpackage 402, such as a directly supported package with a single mountable component surface having a circuit board 404 with contacts 406 exposed and adjacent a first surface 408 and a second surface 410. The circuit board 404 also includes embedded contacts 412 located within the circuit board 404.

The circuit board 404 can preferably include conductive material distributed between the first surface 408 and the second surface 410 to provide connectivity between the contacts 406 and the embedded contacts 412.

The contacts 406 adjacent the first surface 408 can be located between an edge 414 of the circuit board 404 and a plane perpendicular and bisecting the central cross-section of the circuit board 404. The contacts 406 adjacent the second surface 410 can be located between an end of the circuit board 404 opposite the end next to the edge 414 and the plane perpendicular and bisecting the central cross-section of the circuit board 404.

Interconnects 416, such as solder or similar propertied material having a trough cross-sectional shape, can be connected to the contacts 406 of the first surface 408 located between the edge 414 of the circuit board 404 and the plane to provide connectivity between the subpackage 402 and a next level of package integration. The stacking interconnects 118 can be connected to the contacts 406 of the second surface 410. The stacking interconnects 118, substantially exposed on the second surface 410, can provide additional connectivity between the subpackage 402 and another level of package integration.

The first device 120 having connectivity with the circuit board 404, can be mounted with an offset onto the first surface 408. The first encapsulant 122 having a first thickness 430 can be applied over the first device 120 and surround connectivity structures and areas next to the first device 120. The first encapsulant 122 having a second thickness 432 can be applied over the remainder of the first surface 408 surrounding the interconnects 416 with the interconnects 416 exposed adjacent the first encapsulant 122. The magnitude of the first thickness 430 can be substantially greater than the magnitude of the second thickness 432.

The encapsulant side 124 of the first encapsulant 122 nearest the end of the circuit board 404 opposite the end with the edge 414 can be perpendicular to the first surface 408. Other encapsulant sides 126 of the first encapsulant 122 surrounding the first device 120 can be perpendicular to or oblique to the first surface 108.

Note that the orientation, shape, or finish of the encapsulant side 124 or the other encapsulant sides 126 of the first encapsulant 122 are non-restrictive. Also the physical characteristics such as location, distribution, quantity, size, shape, or material of the contacts 406, the interconnects 416, or the stacking interconnects 118 have been chosen for illustrative purposes only. The physical characteristics of the present invention are non-limiting in these aspects and should not be construed as limitations for the present invention.

Referring now to FIG. 5, therein is shown a top view of the integrated circuit package system 400. The interconnects 416 of the subpackage 402 are shown exposed adjacent the first encapsulant 122 and distributed between the edge 414 and a line on the surface of the first encapsulant 122 located equidistant from the edge 414 and a far edge 502.

For illustrative purposes, the interconnects 416 are shown distributed in a rectangular grid arrayed pattern nearest the edge 414. It is noted that the interconnects 416 could have been implemented having other locations or patterns adjacent the first encapsulant 122 such as circular clusters or as random patterns. The positioning and the arrangements of the interconnects 416 are non-restrictive or non-limiting.

Figure 6:
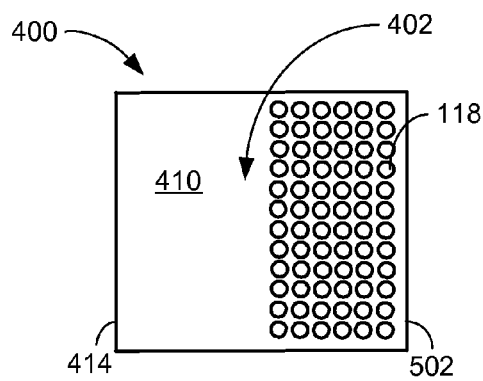
FIG. 6 is a bottom view of the integrated circuit package system.

Referring now to FIG. 6, therein is shown a bottom view of the integrated circuit package system 400. The stacking interconnects 118 of the subpackage 402 are shown exposed adjacent the second surface 410 and distributed between the far edge 502 and a line on the second surface 410 located equidistant from the edge 414 and the far edge 502.

For illustrative purposes, the stacking interconnects 118 are shown distributed in a rectangular grid arrayed pattern nearest the far edge 502. It is noted that the stacking interconnects 118 could have been implemented having other locations or patterns adjacent the second surface 410 such as circular clusters or as random patterns. The positioning and the arrangements of the stacking interconnects 118 are non-restrictive or non-limiting.

Figure 7:
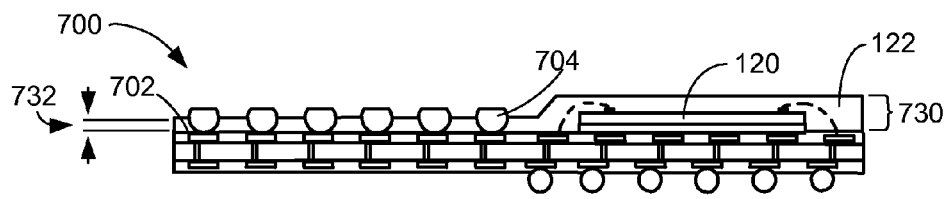
FIG. 7 is a cross-sectional view of an integrated circuit package system in a third embodiment of the present invention.

Referring now to FIG. 7, therein is shown a cross-sectional view of an integrated circuit package system 700 in a third embodiment of the present invention. The integrated circuit package system 700 can preferably include a first surface 702, interconnects 704, the first device 120, the first encapsulant 122 having a first thickness 730, and the first encapsulant 122 having a second thickness 732.

The integrated circuit package system 700 can be similar to the integrated circuit package system 400 except the integrated circuit package system 700 includes interconnects 702, such as solder or similar propertied material having a flattened spherical cross-sectional shape and the first thickness 730 can be twice the magnitude of the second thickness 732.

Each of the interconnects 704 can be oriented and connected such that the end having the flattened region is located furthest away from and parallel with a first surface 702 to provide for connectivity between the integrated circuit package system 400 and a next level of package integration.

Figure 8:
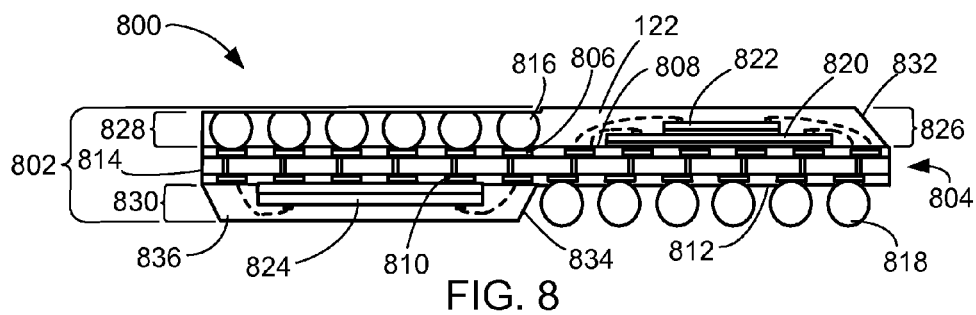
FIG. 8 is a cross-sectional view of an integrated circuit package system in a fourth embodiment of the present invention.

Referring now to FIG. 8, therein is shown a cross-sectional view of an integrated circuit package system 800 in a fourth embodiment of the present invention. The integrated circuit package system 800 can preferably include a subpackage 802, such as a dual supported package with dual mountable component surfaces of a circuit board 804 with contacts 806 exposed and adjacent a first surface 808 and a second surface 812. The circuit board 804 also includes embedded contacts 810 located within the circuit board 804.

The circuit board 804 can preferably include conductive material distributed between the first surface 808 and the second surface 812 to provide connectivity between the contacts 806 and the embedded contacts 810. The contacts 806 adjacent the first surface 808 can be located between an edge 814 of the circuit board 804 and a plane perpendicular and bisecting the central cross-section of the circuit board 804. The contacts 806 adjacent the second surface 812 can be located between the plane perpendicular and bisecting the central cross-section of the circuit board 804 and an end of the circuit board 804 opposite the end adjacent the edge 814.

Interconnects 816, such as solder or similar propertied material having a flattened spherical cross-sectional shape, can be connected to the contacts 806. Each of the interconnects 816 can be oriented and connected such that the end having the flattened region is located furthest away from and parallel with the first surface 808 to provide for connectivity between the subpackage 802 and a next level of package integration.

Stacking interconnects 818, such as solder or similar propertied material having a spherical, cylindrical, or any geometrical shape, can be connected to the contacts 806 of the second surface 812 to provide additional connectivity between the subpackage 802 and another level of package integration.

A first device 820, such as a wire bond chip, a flip chip, a die, or other combination of components with circuitry, having connectivity to the circuit board 804 can be mounted with an offset onto the first surface 808. A chip 822 having connectivity to the circuit board 804 can be mounted on the first device 820. The combined dimensional height of the first device 820 and the chip 822 can be less than the overall dimensional height of the interconnects 816. A second device 824, such as a wire bond chip, a flip chip, a die, or other combination of components with circuitry having connectivity with the circuit board 804, can be mounted onto the second surface 812 having a different offset than the first device 820.

The first encapsulant 122 having a first thickness 826 can be applied over the first device 820, the chip 822, and surround connectivity structures and areas next to the first device 820. The first encapsulant 122 having a second thickness 828 can be applied over the remainder of the first surface 808 surrounding the interconnects 816 with the interconnects 816 exposed adjacent the first encapsulant 122. The magnitude of the first thickness 826 can be similar to the magnitude of the second thickness 828.

A second encapsulant 836, such as an epoxy, molding, or similar type of protective material having a third thickness 830, can be applied over the second device 824 and surround connectivity structures and areas next to the second device 824. The magnitude of the third thickness 830 can have the same magnitude of the first thickness 826. The magnitude of the second thickness 828 can be less than the magnitude of the first thickness 826. The stacking interconnects 818 can have an overall dimensional height greater than the third thickness 830 to enable the stacking of multiple copies of the integrated circuit package system 800 over one another.

An encapsulant side 832 of the first encapsulant 122 nearest the end of the circuit board 804 opposite the end next to the edge 814 can be oblique to the first surface 808. Other encapsulant sides 834 of the first encapsulant 122 or the second encapsulant 836 can be perpendicular to or oblique to the first surface 808.

It has been discovered that with the chip 822 over the first device 820 on the first surface 808 and the second device 824 on the second surface 812, the present invention can result in reduced profile package geometries due to the capability of mounting circuitry on either the first surface 808 or the second surface 812. Furthermore, stacking of multiple copies of the present invention can result in complex and compact sub-system solutions.

Note that the orientation, shape, or finish of the encapsulant side 832 and the other encapsulant sides 834 are non-restrictive. Also the physical characteristics such as location, distribution, quantity, size, shape, or material of the contacts 806, the interconnects 816, or the stacking interconnects 818 have been chosen for illustrative purposes only. The physical characteristics of the present invention are non-limiting in these aspects and should not be construed as limitations for the present invention.

Figure 9:
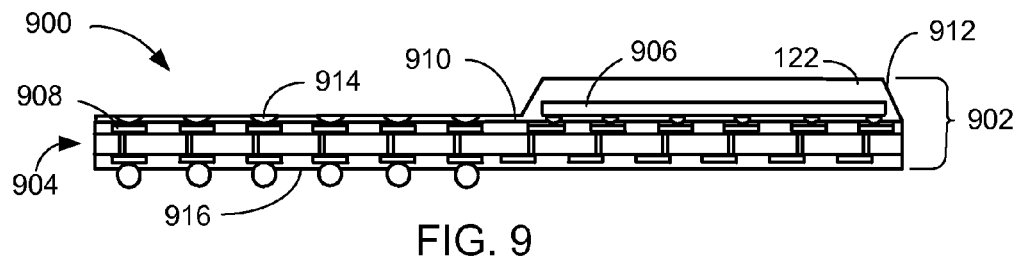
FIG. 9 is a cross-sectional view of an integrated circuit package system in a fifth embodiment of the present invention.

Referring now to FIG. 9, therein is shown a cross-sectional view of an integrated circuit package system 900 in a fifth embodiment of the present invention. The integrated circuit package system 900 can preferably include a stacking subpackage 902 such as a subpackage having a circuit board 904 similar to the subpackage 102 of FIG. 1 except the circuit board 904 of the stacking subpackage 902 includes a flip chip 906 connected to contacts 908 exposed and adjacent a first surface 910.

Also an encapsulant side 912 of the first encapsulant 122 can have an angle less than ninety degrees with respect to a horizontal plane located on the first surface 910. Note that the orientation, shape, or finish of the encapsulant side 912 of the first encapsulant 122 is non-restrictive.

The stacking subpackage 902 also includes interconnects 914, such as solder or similar propertied material having a trough cross-sectional shape, connecting to the contacts 908 of the first surface 910 and the contacts 908 located adjacent a second surface 916.

Attributes such as quantity, size, location, distribution, or material of the contacts 908 and the interconnects 914 are identical to corresponding attributes of the contacts 106 of FIG. 1 and the interconnects 116 of FIG. 1 respectively.

Figure 10:
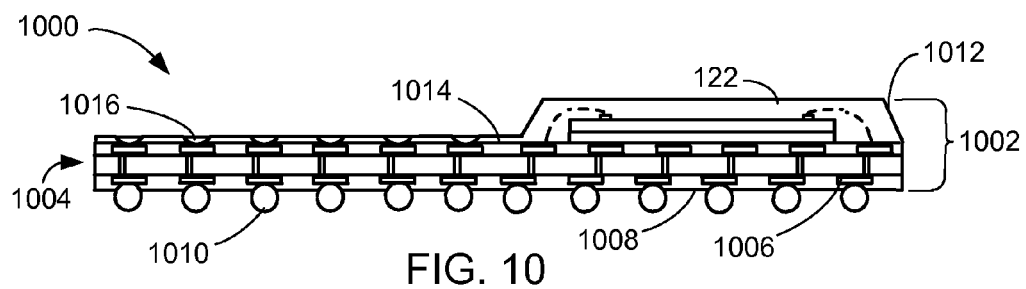
FIG. 10 is a cross-sectional view of an integrated circuit package system in a sixth embodiment of the present invention.

Referring now to FIG. 10, therein is shown a cross-sectional view of an integrated circuit package system 1000 in a sixth embodiment of the present invention. The integrated circuit package system 1000 can preferably include a base subpackage 1002 such as a subpackage having a circuit board 1004 similar to the subpackage 102 of FIG. 1, except the circuit board 1004 of the base subpackage 1002 includes contacts 1006 substantially distributed, exposed and adjacent a second surface 1008. Stacking interconnects 1010, such as solder or similar propertied material having a spherical, cylindrical, or any geometrical shape, can be attached to the contacts 1006 of the second surface 1008.

An encapsulant side 1012 of the first encapsulant 122 can have an angle less than ninety degrees with respect to a horizontal plane located on a first surface 1014. The base subpackage 1002 also includes the contacts 1006 exposed and adjacent the first surface 1014 and interconnects 1016, such as solder or similar propertied material having a trough cross-sectional shape, can be connected to the contacts 1006 of the first surface 1014.

Note that the orientation, shape, or finish of the encapsulant side 1012 of the first encapsulant 122 are non-restrictive. Attributes such as quantity, size, location, distribution, or material of the interconnects 1016 are identical to corresponding attributes of the interconnects 116 of FIG. 1.

Figure 11:
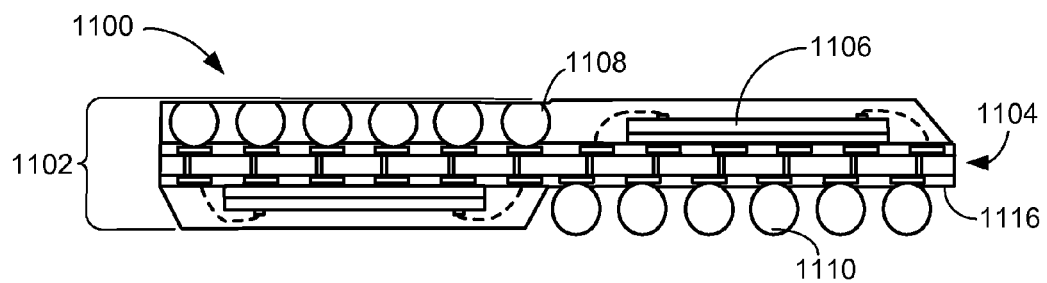
FIG. 11 is a cross-sectional view of an integrated circuit package system in a seventh embodiment of the present invention.

Referring now to FIG. 11, therein is shown a cross-sectional view of an integrated circuit package system 1100 in a seventh embodiment of the present invention. The integrated circuit package system 1100 can preferably include a subpackage 1102 having a circuit board 1104, a wire bond chip 1106, interconnects 1108, and stack interconnects 1110. The subpackage 1102 of the integrated circuit package system 1100 is similar to the subpackage 802 of FIG. 8 except the circuit board 1104 of the subpackage 1102 includes the wire bond chip 1106.

Figure 12:
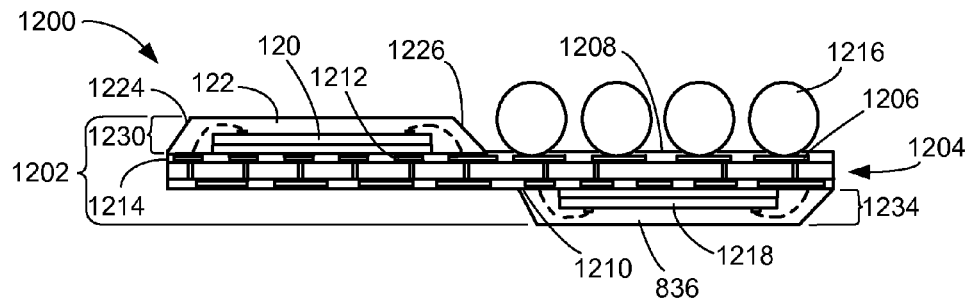
FIG. 12 is a cross-sectional view of an integrated circuit package system in an eighth embodiment of the present invention.

Referring now to FIG. 12, therein is shown a cross-sectional view of an integrated circuit package system 1200 in an eighth embodiment of the present invention. The integrated circuit package system 1200 can preferably include a subpackage 1202, such as a single supported package with a dual mountable component surfaces having a circuit board 1204 with contacts 1206 exposed and adjacent a first surface 1208 and a second surface 1210.

The circuit board 1204 can preferably include conductive material distributed between the first surface 1208 and the second surface 1210 to provide connectivity between the contacts 1206 and embedded contacts 1212 located within the circuit board 1204.

The contacts 1206 adjacent the first surface 1208 can be located between an end of the circuit board 1204 opposite the end next to the edge 1214 and a plane perpendicular and bisecting the central cross-section of the circuit board 1204. The contacts 1206 adjacent the second surface 1210 can be located between the plane perpendicular and bisecting the central cross-section of the circuit board 1204 and the edge 1214. The contacts 1206 of the second surface 1210 can be used to provide additional connectivity between the subpackage 1202 and another level of package integration.

Interconnects 1216, such as solder or similar propertied material having a spherical cross-sectional shape, can be connected to the contacts 1206 adjacent the first surface 1208 to provide for connectivity between the subpackage 1202 and a next level of package integration.

The first device 120 having connectivity with the circuit board 1204 can be mounted with an offset on the first surface 1208. A second device 1218, such as a wire bond chip, a flip chip, a die, or other combination of components with circuitry, having connectivity with the circuit board 1204 can be mounted on the second surface 1210 with a different offset from the first device 120.

The first encapsulant 122 having a first thickness 1230 can be applied over the first device 120 surrounding connectivity structures and areas next to the perimeter of the first device 120 and with the remaining surface of the circuit board 1204 adjacent the first device 120 substantially exposed. The second encapsulant 836 having a third thickness 1234 can be applied over the second device 1218 and surround connectivity structures and areas of the circuit board 1204 next to the second device 1218. The interconnects 1216 can have a height twice as great as the magnitude of the first thickness 1230. The magnitude of the first thickness 1230 can be identical to the same magnitude of the third thickness 1234.

Encapsulant sides 1224 of the first encapsulant 122 at the end next to the edge 1214 and the second encapsulant 836 at the opposite end of the circuit board 1204 can be oblique to the first surface 1208. Other encapsulant sides 1226 of the first encapsulant 122 and the second encapsulant 836 can be perpendicular to or oblique to the first surface 108. Note that the orientation, shape, or finish of the encapsulant sides 1224 and the other encapsulant sides 1226 of the first encapsulant 122 and the second encapsulant 836 are non-restrictive.

Note that the physical characteristics such as location, distribution, quantity, size, shape, or material of the contacts 1206 and the first interconnects 1216 have been chosen for illustrative purposes only. The physical characteristics of the present invention are non-limiting in these aspects and should not be construed as limitations for the present invention.

Figure 13:
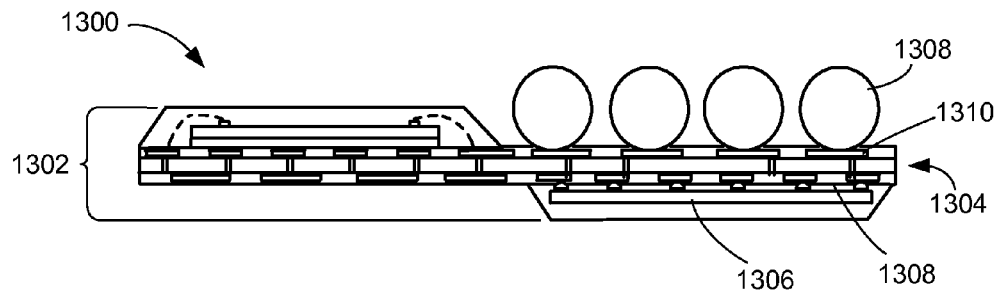
FIG. 13 is a cross-sectional view of an integrated circuit package system in a ninth embodiment of the present invention.

Referring now to FIG. 13, therein is shown a cross-sectional view of an integrated circuit package system 1300 in a ninth embodiment of the present invention. The integrated circuit package system 1300 can preferably include a subpackage 1302 having a circuit board 1304, a flip chip 1306, interconnects 1308, and contacts 1310. The subpackage 1302 of the integrated circuit package system 1300 is similar to the subpackage 1202 of FIG. 12 except the circuit board 1304 of the subpackage 1302 includes the flip chip 1306.

Figure 14:
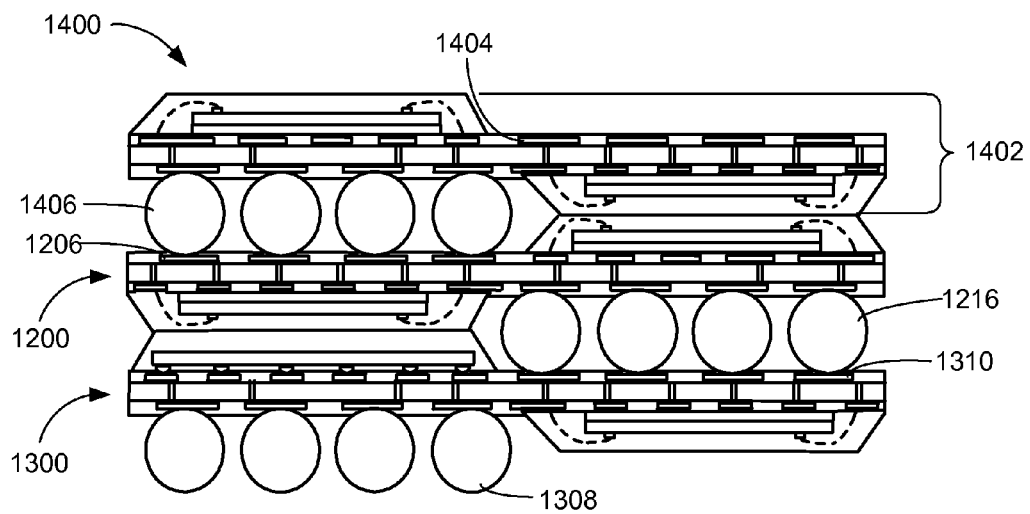
FIG. 14 is a cross-sectional view of an integrated circuit package system in a tenth embodiment of the present invention.

Referring now to FIG. 14, therein is shown a cross-sectional view of an integrated circuit package system 1400 in a tenth embodiment of the present invention. The integrated circuit package system 1400 can preferably include the integrated circuit package system 1300, the integrated circuit package system 1200, and a package 1402 such as identical copy of the integrated circuit package system 1200 having second contacts 1404 and interconnects 1406.

Attributes such as quantity, size, location, distribution, or material of the contacts 1404 and the interconnects 1406 of the package 1402 are identical to corresponding attributes of the contacts 1206 and the interconnects 1216 respectively.

The integrated circuit package system 1200 can be mounted over and connected to the integrated circuit package system 1300 by connecting the interconnects 1216 of the integrated circuit package system 1200 to the contacts 1310 of the integrated circuit package system 1300. The package 1402 can be mounted over and connected to the integrated circuit package system 1200 by connecting the interconnects 1406 of the package 1402 with the contacts 1206 of the integrated circuit package system 1200.

The contacts 1404 or the interconnects 1308 can provide connectivity between the integrated circuit package system 1400 and at least one next level of integration.

Figure 15:
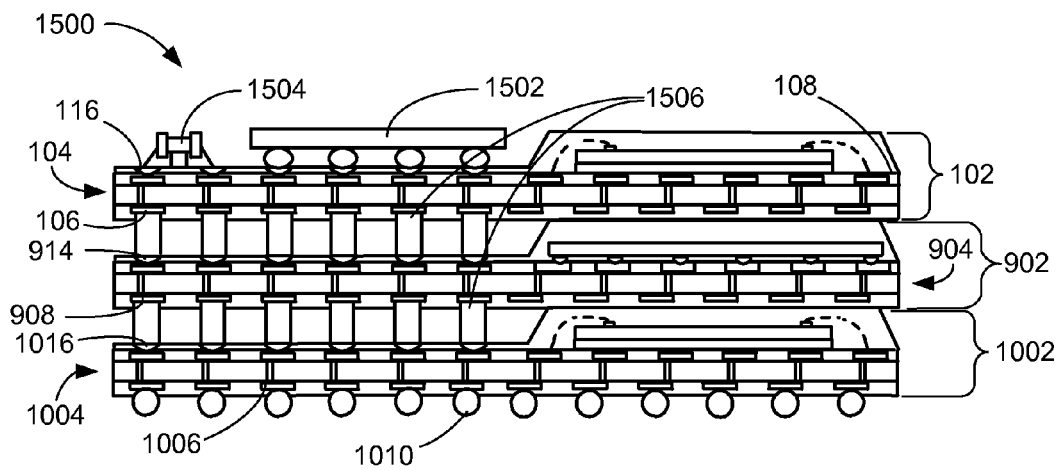
FIG. 15 is a cross-sectional view of an integrated circuit package system in an eleventh embodiment of the present invention.

Referring now to FIG. 15, therein is shown a cross-sectional view of an integrated circuit package system 1500 in an eleventh embodiment of the present invention. The integrated circuit package system 1500 can preferably include the base subpackage 1002, the stacking subpackage 902, the subpackage 102 having the circuit board 104, a package 1502, and a discrete component 1504 such as a resistor, capacitor, diode, transistor, or similar electronic part.

The stacking subpackage 902 can be mounted over and connected to the base subpackage 1002 using stacking interconnects 1506, such as solder or similar propertied material cylindrical in shape, to connect between the contacts 908 of the stacking subpackage 902 and the first interconnects 1016 of the base subpackage 1002. The subpackage 102 can be mounted over and connected to the stacking subpackage 902 using the stacking interconnects 1506 to connect between the contacts 106 of the subpackage 102 and the interconnects 914 of the stacking subpackage 902.

The package 1502, such as a ball grid array package, can be connected on to the interconnects 116 adjacent the first surface 108 of the subpackage 102. The discrete component 1504, also having connectivity with the interconnects 116, can be mounted over the first surface 108 of the subpackage 102. The base subpackage 1002 can include the stacking interconnects 1010, such as solder or similar propertied material having a spherical, cylindrical, or any geometrical shape, attached to the contacts 1006 of the base subpackage 1002 to provide connectivity between the integrated circuit package system 1500 and a next level of integration.

It is noted that other electronic parts or packages having connectivity provisions compatible for attachment to the interconnects 116 could be mounted over the subpackage 102, the package 1502 and the discrete component 1504 have been selected for purposes of illustration for this embodiment.

Figure 16:
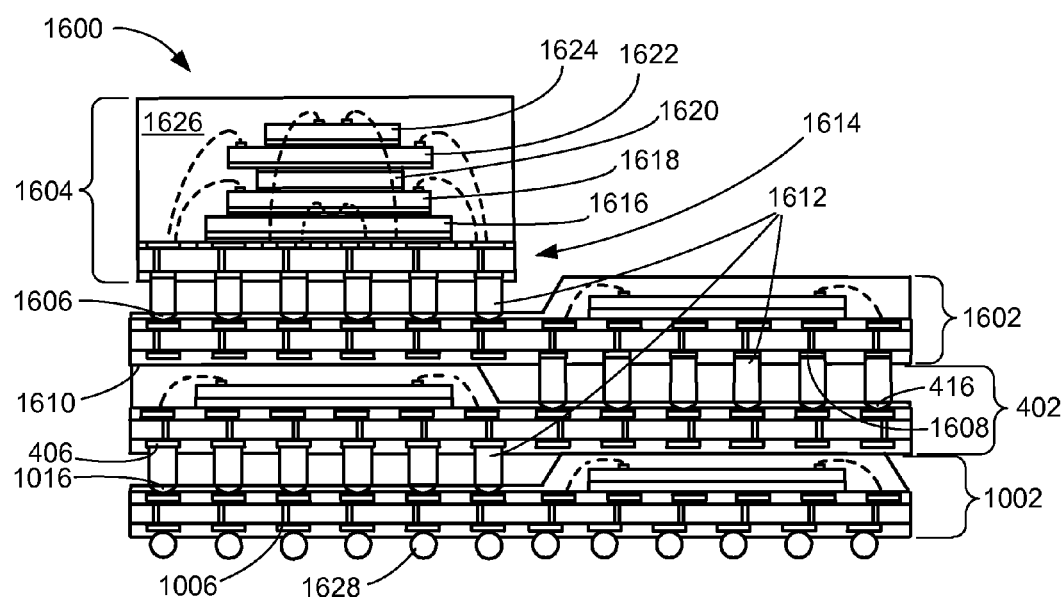
FIG. 16 is a cross-sectional view of an integrated circuit package system in a twelfth embodiment of the present invention.

Referring now to FIG. 16, therein is shown a cross-sectional view of an integrated circuit package system 1600 in a twelfth embodiment of the present invention. The integrated circuit package system 1600 can preferably include the base subpackage 1002, the subpackage 402, a subpackage 1602, and a package 1604.

The subpackage 1602 can be the identical to the subpackage 402 and include having interconnects 1606 such as solder or similar propertied material having a trough cross-sectional shape and contacts 1608, exposed and adjacent a second surface 1610. Attributes such as quantity, size, location, distribution, or material of the interconnects 1606 and the contacts 1608 of the subpackage 1602 are identical to corresponding attributes of the interconnects 416 and the contacts 406 respectively.

The subpackage 402 can be mounted over and connected to the base subpackage 1002 using stacking interconnects 1612, such as solder or similar propertied material cylindrical in shape, to connect the contacts 406 of the subpackage 402 with the interconnects 1016 of the base subpackage 1002. The subpackage 1602 can be mounted over and connected to the subpackage 402 using the stacking interconnects 1612 to connect the contacts 1608 of the subpackage 1602 with the interconnects 416 of the subpackage 402.

The package 1604, such as a multi-chip, multi-module, or package combination thereof, can be mounted over and connected with the subpackage 1602 using the stacking interconnects 1612. The stacking interconnects 1612 connect a package substrate 1614 of the package 1604 with the interconnects 1606 of the subpackage 1602. The package 1604 can include a first chip 1616 having connectivity with the package substrate 1614 mounted over the package substrate 1614. A second chip 1618, similar to the first chip 1616, having connectivity with the package substrate 1614 can be mounted over the first chip 1616.

An insulative spacer 1620 can be mounted over the second chip 1618 to isolate the second chip 1618 from any components mounted above the second chip 1618 within the package 1604. A third chip 1622, similar to the second chip 1618, having connectivity to the package substrate 1614 can be mounted over the insulative spacer 1620. A fourth chip 1624 having connectivity to the package substrate 1614 can be mounted over the third chip 1622.

An encapsulant 1626 can be applied over the fourth chip 1624, the third chip 1622, the insulative spacer 1620, the second chip 1618, the first chip 1616, the package substrate 1614, and surround connectivity structures and areas above and adjacent the package substrate 1614 within the package 1604. The base subpackage 1002 can include base interconnects 1628, as solder or similar propertied material having a spherical, cylindrical, or any geometrical shape, attached to the contacts 1006 of the base subpackage 1002 to provide connectivity between the integrated circuit package system 1600 and a next level of integration.

Figure 17:
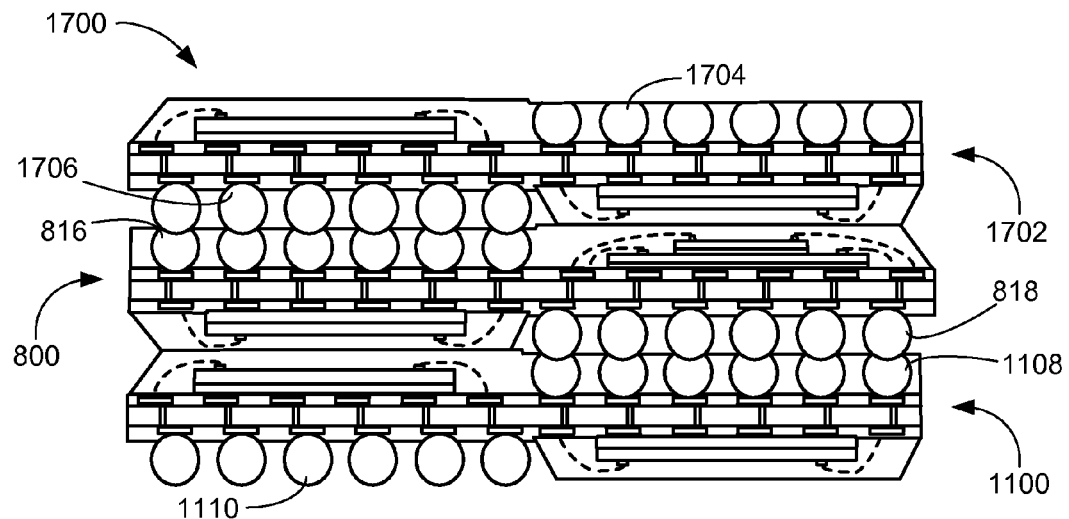
FIG. 17 is a cross-sectional view of an integrated circuit package system in a thirteenth embodiment of the present invention.

Referring now to FIG. 17, therein is shown a cross-sectional view of an integrated circuit package system 1700 in a thirteenth embodiment of the present invention. The integrated circuit package system 1700 can preferably include the integrated circuit package system 1100, the integrated circuit package system 800, and an integrated circuit package system 1702 having interconnects 1704 and stacking interconnects 1706.

The integrated circuit package system 1702 is identical to the integrated circuit package system 1100 and thus attributes such as quantity, size, location, distribution, or material of the interconnects 1704 and the stacking interconnects 1706 are identical to corresponding attributes of the interconnects 1108 and the stacking interconnects 1110 of the integrated circuit package system 1100.

The integrated circuit package system 800 can be mounted over and connected to the integrated circuit package system 1100 by connecting the stacking interconnects 818 of the integrated circuit package system 800 with the interconnects 1108 of the integrated circuit package system 1100. The integrated circuit package system 1702 can be mounted over and connected to the integrated circuit package system 800 by connecting the second interconnects 1706 of the integrated circuit package system 1702 with the interconnects 816 of the integrated circuit package system 800.

The interconnects 1704 or the stacking interconnects 1110 can be used to provide connectivity between the integrated circuit package system 1700 and one or more level of integration.

Figure 18:
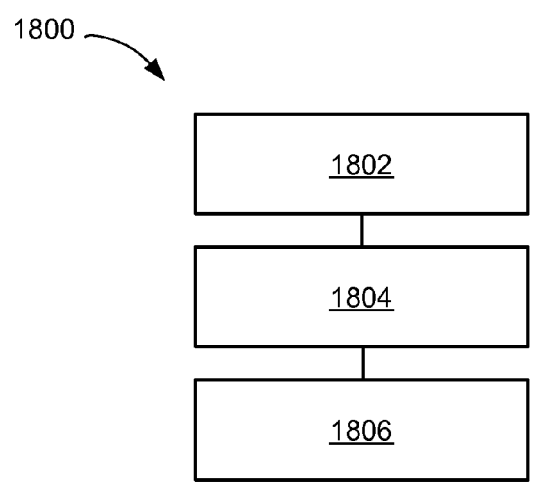
FIG. 18 is shown a flow chart of method of manufacturing of an integrated circuit package system in a further embodiment of the present invention.

Referring now to FIG. 18, therein is shown a flow chart of a method 1800 of manufacturing of the integrated circuit package system 100 in a further embodiment of the present invention. The method 1800 includes providing a circuit board having an interconnect thereon in a block 1802; mounting a first device offset on the circuit board in a block 1804; and applying a first encapsulant of a first thickness over the first device, the first encapsulant of a second thickness thinner than the first thickness over the remainder of the circuit board with the interconnect exposed, or a second encapsulant of a third thickness over a second device on an opposite surface of the circuit board and differently offset from the first device in a block 1806.

In greater detail, a system to provide the method and apparatus of the integrated circuit package system 100, in an embodiment of the present invention, is performed as follows:

1. Providing a circuit board with a contact having an interconnect thereon.
2. Mounting a first device offset on a first surface of the circuit board.
3. Applying a first encapsulant of a first thickness over the first device and next to the first device, the first encapsulant of a second thickness thinner than the first thickness over the remainder of the circuit board and surround the interconnect with the interconnect exposed, or a second encapsulant of a third thickness over a second device and next to the second device on a second surface of the circuit board and differently offset from the first device.

Thus, it has been found that the integrated circuit package system method and apparatus of the present invention furnish important and heretofore unknown and unavailable solutions, capabilities, and functional aspects. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method of manufacturing for an integrated circuit package system comprising:
   providing a circuit board having an interconnect thereon;
   mounting device between a central cross-section of and a far edge of the circuit board; and
   applying an encapsulant having a thickness over the device and another thickness offset from the device, the thickness directly covers the central cross-section and extends to the far edge, the another thickness directly covers the circuit board from the central cross-section to an edge of the circuit board opposite and facing away from the far edge.

2. The method as claimed in claim 1 wherein:
   mounting the device includes mounting the device having connectivity with the circuit board.

3. The method as claimed in claim 1 further comprising:
   connecting a stacking interconnect to the opposite surface of the circuit board between a central cross-section of the circuit board and an end of the circuit board.

4. The method as claimed in claim 1 further comprising:
   connecting a stacking interconnect to any location on the opposite surface of the circuit board.

5. The method as claimed in claim 1 wherein connecting the interconnect between a central cross-section of the circuit board and an end of the circuit board.

6. A method of manufacturing for an integrated circuit package system comprising:
   providing a circuit board with a contact having an interconnect thereon;
   mounting a device between a central cross-section of and a far edge of a surface of the circuit board; and
   applying an encapsulant having a thickness over the device and another thickness offset from the device, the thickness directly covers the surface of the central cross-section and extends to the far edge, the another thickness directly covers the circuit board from the central cross-section to an edge of the circuit board opposite and facing away from the far edge.

7. The method as claimed in claim 6 wherein:
   mounting the device includes connecting the device to the circuit board.

8. The method as claimed in claim 6 further comprising:
   connecting a stacking interconnect to the contact adjacent the second surface located between a plane perpendicular and bisecting the central cross-section of the circuit board and the end of the circuit board.

9. The method as claimed in claim 6 further comprising:
   connecting a stacking interconnect to any of the contact located adjacent the second surface.

10. The method as claimed in claim 6 wherein connecting the interconnect to the contact adjacent the circuit board between a plane perpendicular and bisecting a central cross-section of the circuit board and an end of the circuit board.

11. An integrated circuit package system comprising:
    a circuit board having an interconnect thereon;
    a device mounted between a central cross-section of and a far edge of the circuit board; and
    an encapsulant applied having a thickness over the device and another thickness offset from the device, the thickness directly covers the central cross-section and extends to the far edge, the another thickness directly covers the circuit board from the central cross-section to an edge of the circuit board opposite and facing away from the far edge.

12. The system as claimed in claim 11 wherein:
    the device mounted includes the device having connectivity with the circuit board.

13. The system as claimed in claim 11 further comprising:
    a stacking interconnect connected to the opposite surface of the circuit board between a central cross-section of the circuit board and an end of the circuit board.

14. The system as claimed in claim 11 further comprising:
    a stacking interconnect connected to any location on the opposite surface of the circuit board.

15. The system as claimed in claim 11 wherein the interconnect connected between a central cross-section of the circuit board and an end of the circuit board.

16. The system as claimed in claim 11 wherein:
    the device mounted between a central cross-section of and a far edge of a surface of the circuit board; and
    an encapsulant applied having a thickness over the device and another thickness offset from the device, the thickness directly covers the surface of the central cross-section and extends to the far edge, the another thickness directly covers the circuit board from the central cross-section to an edge of the circuit board opposite and facing away from the far edge.

17. The system as claimed in claim 16 wherein:
    the device mounted includes the device connected to the circuit board.

18. The system as claimed in claim 16 further comprising:
    a stacking interconnect connected to the contact adjacent the second surface located between a plane perpendicular and bisecting the central cross-section of the circuit board and the end of the circuit board.

19. The system as claimed in claim 16 further comprising:
    a stacking interconnect connected to any of the contact located adjacent the second surface of the circuit board.

20. The system as claimed in claim 16 wherein the interconnect connected to the contact adjacent the circuit board between a plane perpendicular and bisecting a central cross-section of the circuit board and an end of the circuit board.

* * * * *

UNITED STATES PATENT AND TRADEMARK OFFICE
CERTIFICATE OF CORRECTION

| | |
|---|---|
| PATENT NO. | : 8,130,512 B2 |
| APPLICATION NO. | : 12/273541 |
| DATED | : March 6, 2012 |
| INVENTOR(S) | : Yoon et al. |

It is certified that error appears in the above-identified patent and that said Letters Patent is hereby corrected as shown below:

Column 13:

claim 1, line 24, delete "mounting device" and insert therefor --mounting a device--

Signed and Sealed this
Eleventh Day of September, 2012

David J. Kappos
*Director of the United States Patent and Trademark Office*